United States Patent [19]

Brown et al.

[11] 4,191,789
[45] Mar. 4, 1980

[54] FABRICATION OF BI-LEVEL CIRCUITS

[75] Inventors: John F. Brown, Emmaus; Robert M. Stanton, Allentown, both of Pa.

[73] Assignee: Bell Telephone Laboratories, Incorporated, Murray Hill, N.J.

[21] Appl. No.: 956,885

[22] Filed: Nov. 2, 1978

[51] Int. Cl.$^2$ .......................... H05K 1/04; H05K 1/08
[52] U.S. Cl. ..................................... 427/97; 427/123;
427/125; 427/282; 427/376 B; 427/377;
427/380; 29/625; 174/685
[58] Field of Search ..................... 427/97, 376 B, 282,
427/380, 123, 125, 377; 29/625; 174/68.5

[56] References Cited
U.S. PATENT DOCUMENTS

| | | | |
|---|---|---|---|
| 3,269,861 | 8/1966 | Schneble | 427/97 |
| 3,357,856 | 12/1967 | Ragan | 427/97 |
| 3,647,532 | 3/1972 | Friedman | 252/512 |
| 4,020,206 | 4/1977 | Beil | 427/97 |
| 4,024,629 | 5/1977 | Lemoine | 427/97 |
| 4,064,290 | 12/1977 | Ebel | 427/97 |

OTHER PUBLICATIONS

Kline et al., "*Thick Film . . . Through Holes*", 1973 Internation. Microelectronics Symposium, pp. 3A-2-1 to 3A-2-6.

*Primary Examiner*—Michael F. Esposito
*Attorney, Agent, or Firm*—Lester H. Birnbaum

[57] ABSTRACT

Disclosed is a method of fabricating bi-level circuits which include metallization of via holes (14 and 15) in insulating subustrates (10). A thick film metal paste (13) is prepared which according to one embodiment comprises copper, glass frit and an organic vehicle including a low molecular weight ethyl cellulose binder and solvents of butyl carbitol acetate and alpha terpineol. The paste is deposited onto the substrate and through the holes. The structure is baked with the printed surface (12) down in order to establish a solvent concentration gradient in the paste which results in solid material accumulating away from the printed surface to form the contact pad (16). The material is then fired to establish the desired conductivity.

14 Claims, 5 Drawing Figures

FABRICATION OF BI-LEVEL CIRCUITS

BACKGROUND OF THE INVENTION

This invention relates to fabrication of bi-level circuits, and in particular to metallizing the surface and the via holes in the insulating substrate.

In a wide variety of circuit applications, it is desirable to form conductors on both major surfaces of an insulating substrate and interconnect the two sides through holes formed in the substrate. Such bi-level circuits may take the form of thick film circuits, thin film circuits or hybrid integrated circuits. In some instances, it is desirable to form the circuit on one surface of the substrate and provide a ground plane connection on the other surface. It is also possible to pattern circuits on both sides of the substrate, and further to provide thick film metallization on one surface and thin film metallization on the other surface.

One of the difficulties associated with forming bi-level circuits is coating the via holes in the substrate to provide the interconnections. Several methods have been proposed to accomplish such coating with varying degrees of success. One method is to plug the holes with a metal insert. One problem associated with this method is cracking of the substrate as a result of the high sintering temperatures needed for succeeding thick film layers if the coefficient of expansion of the metal is not well matched to that of the substrate. Another technique is to deposit a thick film paste over the hole and insure complete coverage of the walls by applying a vacuum and causing the paste to flow through the hole. In such processes, subsequent sintering can cause severe shrinkage of the paste resulting in the conductor breaking loose from the walls of the hole. Low shrinkage pastes, on the other hand, tend to have high viscosity and will not easily flow into the hole when the vacuum is applied. (See, for example, Kline et al "Thick Film Techniques for Printing Fine Lines and Plating Through Holes," 1973 *International Microelectronic Symposium*, pp. 3A-2-1 to 3A-2-6 (Oct. 22–24, 1973).) Another method for coating holes is drawing a deposited liquid metal through the hole with a vacuum nozzle (See, for example, U.S. Pat. No. 3,357,856). Handling molten metals can be difficult, and in general, drawing material through a hole by creating a vacuum could result in splattering. Several other methods for metallizing holes involving thin film technology, such as electroless deposition or evaporation and electroplating of metals on the side walls, have also been taught. (See, for example, U.S. Pat. No. 3,269,861). Such processes tend to require small lot size, and excessive care to insure adequate coverage without entrapment of air bubbles or various chemicals.

From an economical viewpoint, formation of surface conductors and interconnections by thick film techniques appears most desirable. However, it will be appreciated that prior art thick film processes in general have not produced reliable coverage of the via holes. This is due to the fact that the paste must have good flow properties, adhere to the substrate, and still be compatible with sintering needed for thick film processes. In addition, the resulting conductor must possess the desired conductivity after sintering. Furthermore, it is desirable that during processing the paste form a contact pad on the opposite surface for easy electrical contact to the circuit elements on that surface.

It is therefore a primary object of the invention to provide a method utilizing thick film pastes for forming surface conductors, coating via holes and establishing contact pads on the opposite surface of the substrate. It is a further object to coat the side walls of via holes without substantial cracks or voids and with the proper conductivity for interconnection of the two sides of the circuit. It is a further object of the invention to provide a composition of paste which is compatible with such a method.

SUMMARY OF THE INVENTION

These and other objects are achieved in accordance with the invention. The invention in one aspect is a method of fabricating bi-level circuits including metallizing holes in an insulating substrate. A thick film paste which includes a metal or metal oxide and an organic vehicle comprising a binder and at least one solvent is deposited onto one major surface of the substrate and into the holes. The resulting structure is heated with the deposited surface down to evaporate the solvent in such a manner that the remaining paste material coats the sides of the holes and accumulates at the surface opposite the deposited surface to form contact pads at the opposite surface. The remaining paste material is fired to establish a desired conductivity.

In accordance with one embodiment, the paste comprises copper powder, glass frit and an organic vehicle which includes a low molecular weight ethyl cellulose binder and solvents of butyl carbitol acetate and alpha terpineol. Firing is done first in an oxidizing ambient and then in a reducing ambient to establish the desired conductivity.

The invention therefore provides a convenient and economical means of metallizing the surface of a substrate, coating via holes, and forming contact pads with thick film pastes without the formation of substantial cracks or voids.

BRIEF DESCRIPTION OF THE DRAWING

These and other features of the invention are described in detail in the following description. In the drawing.

It will be appreciated that for purposes of illustration, these Figures are not drawn to scale.

DETAILED DESCRIPTION

Figure 1:
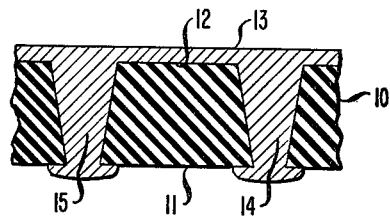
FIGS. 1–3 are cross-sectional views of a portion of a bi-level circuit in various stages of fabrication in accordance with one embodiment of the invention.
Figure 2:
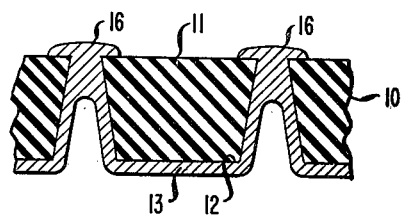
Figure 3:
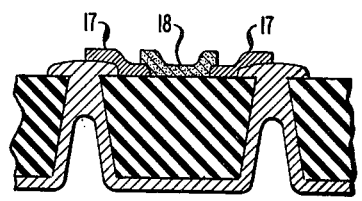

The invention will be described in relation to formation of a ground plane connection on one surface of the substrate in a bi-level circuit as shown in FIGS. 1–3. It will be appreciated, however, that the invention may be employed whenever it is desirable to form conductor and/or circuit elements on both major surfaces of an insulating substrate and to interconnect the elements on the two surfaces.

An insulating substrate, a portion of which is illustrated as 10 in FIG. 1, is provided with major surfaces 11 and 12. In this particular example, the substrate was approximately 99 percent alumina measuring approximately 3.75×4.50×0.025 inches containing 67 laterdrilled holes with tapered walls each having a diameter of approximately 6 mils at surface 11. Two of said holes are illustrated as 14 and 15 in FIG. 1. The holes could also be substantially cylindrical if, for example, the holes were punch-pressed. It is expected that the present invention could be used most advantageously with an insulating substrate wherein the holes have a diameter of 3–50 mils at surface 11 and a thickness of 10–75 mils.

In this particular illustrative circuit, it is desirable to provide a uniform metal coating on surface 12 having a sheet resistance of less than 0.007 ohms per square to serve as a ground plane. It is also desirable to produce a via resistance of less than or equal to 0.013 ohms, and contact pads of approximately 0.030 inches in diameter on surface 11.

As shown, in FIG. 1, a thick film paste 13, was deposited on surface 12 to uniformly cover the surface and fill the holes 14 and 15. The method of deposition was the standard thick film screen printing operation. It should be apparent that sufficient pressure should be applied to the paste while printing to insure that the paste fills the holes. This can be done by varying a number of deposition conditions, such as the angle that the squegee makes with the substrate surface, the number of passes, and the speed of application. The appropriate conditions for particular pastes and hole sizes can be easily determined. In this particular example, utilizing a 145 mesh screen, the squegee was applied at an angle of approximately 20 degrees to the substrate and the holes were filled with just two passes at a speed of 1.25 inches/sec.

The thickness of the deposited layer on surface 12 was approximately 1.5–2 mils. It should be realized that although a uniform layer was deposited in this example, the paste could also be formed as a patterned layer to define individual conductor elements.

The thick film paste basically comprises a metal or metal oxide and an organic vehicle comprising a binder and at least one solvent. A glass frit may also be included to promote adhesion of the paste to the substrate.

In this particular example, the metal was copper which was provided in the form of a powder having particle sizes of 1–3 microns which is sold by Metz Metallurgical Corp. For a 100 gm batch, approximately 55 gms of the powder was loaded into a ball mill with approximately 5 gms of a glass frit. It is desirable to utilize a glass frit which does not contain easily reducible components such as lead. It is also desirable to provide a glass frit which will sinter at a temperature compatible with sintering of the metal and which will achieve a suitable match of thermal expansion coefficient with the substrate. The particular material used was a composition including $K_2O$, $Na_2O$, $MgO$, $ZnO$, $Li_2O$, $Al_2O_3$, $B_2O_3$ and $SiO_2$ which is sold by the O. Hommel Company under the designation PF-497. Approximately 30 gms of methyl alcohol and 10 gms of alpha terpineol were also included in the mill. The purpose of the methyl alcohol is to wet the copper powder during milling, while the alpha terpineol serves to prevent subsequent caking or agglomeration. Other suitable solvents may be used to provide these functions.

The materials were ball milled for approximately 18 hours to reduce the size of the glass frit and to completely mix the solids. In accordance with standard techniques the resulting mixture was filtered through a number 589 highly retentive filter paper and dried by heating at 100 degrees C. for 5 min. This step results in evaporation of substantially all of the methyl alcohol and approximately 90 percent of the alpha terpineol.

It should be appreciated that the method of the present invention may also be compatible with a paste containing other metals usually found in thick film pastes, such as silver, palladium, nickel, gold, and alloys thereof, as well as a paste formed with a metal oxide powder. In addition, a fritless paste may be employed.

An important consideration in the practice of the invention is the proper choice of an organic vehicle for producing a screenable paste. A binder and solvent system should preferably be chosen so as to produce a maximum solid content while providing the proper rheological properties for hole filling and fine line printing. As will become clearer in the subsequent description, it is also preferred to choose a solvent system which possesses a high boiling point (i.e., greater than 150 degrees C.) and a low vapor pressure (i.e., less than 0.8 mm Hg).

In accordance with one embodiment of the invention, the organic vehicle comprised ethyl cellulose as a binder and butyl carbitol acetate and alpha terpineol as solvents. Preferably, the ethyl cellulose has a molecular weight of less than or equal to 40,000 to permit good solid loading and minimum shrinkage. In this particular example, a 10 percent solution was prepared by mixing approximately 10 gms of the binder with 45 gms each of the solvents. Other low vapor pressure solvents in which the binder is soluble might also be employed, such as carbitol acetate, pine oil, butyl phthalate and decanol.

In this particular paste, the ethyl cellulose binder preferably constitutes 8–11 percent of the organic vehicle, with the remainder being the solvents. In general, the binder preferably comprises 3–20 percent of the vehicle. Either of the two solvents can be varied from 0–100 percent of the solvent for the vehicle.

The dried copper powder and frit was mixed with the organic vehicle to form a thick film paste having approximately 75 percent by weight of the former and approximately 25 percent by weight of the latter. A useful range for the solids (metal and frit) would appear to be approximately 40–90 percent of the paste.

Figure 4:
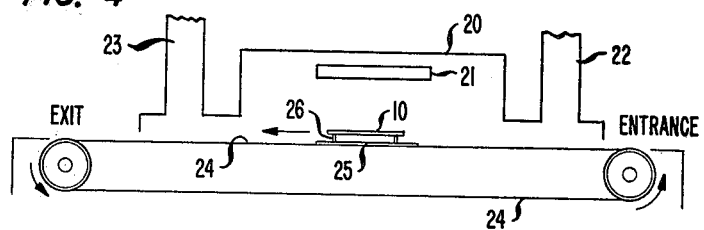
FIG. 4 is a cross-sectional schematic view of an apparatus which may be utilized with the invention.

After the paste was deposited on one surface of the substrate and in the holes, the structure was placed in an appropriate furnace for drying. One example of such a furnace is shown schematically in FIG. 4. The apparatus includes a chamber, 20, an infrared heater panel, 21, at the top and exhaust pipes 22 and 23 for removing evaporated solvents. A continuous belt, 24, supplies the workpieces to be dried.

Figure 5:
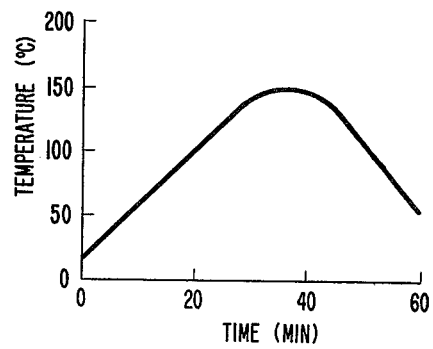
FIG. 5 is a graph of temperature versus time for a baking step in accordance with one embodiment of the invention.

The substrate, 10, was positioned with the printed surface down on a horizontal support (setter plate 25) and separated therefrom by spacers 26. The spacing is chosen to provide controlled circulation of air and evaporation of the solvents at the bottom surface during baking. In this example, the spacing was approximately 50 mils, although a spacing of 20–120 mils would appear to be useful. The structure was introduced into the furnace by placing it on the belt 25 as shown. The temperature was then increased, as shown by the graph of FIG. 5, until it reached 150 degrees C. The structure was baked at that temperature for approximately 15 minutes to evaporate the solvents while the binder remained to hold the metal and frit together in intimate contact with the substrate. The total heating time was approximately 1 hour.

The positioning of the substrate with the printed surface down and a controlled distance from the horizontal support member (setter plate) establishes a solvent concentration gradient during baking that decreases from the printed surface (back ends of the holes) to the opposite surface (front ends of the holes). This gradient is established since the front ends dry rapidly to prevent flow of solvents therethrough, while at the same time, evaporation of solvents at the back ends of the holes is controlled due to the spacing from the setter plate. Thus, during baking, the paste at the back ends of the holes remains fluid enough to permit most of the solids to consolidate toward the front ends while still coating the sidewalls at the back ends. The resulting structure is illustrated in FIG. 2.

The bulk of the paste material after baking was therefore positioned reproducibly at the front ends of the holes to form contact pads, 16, to elements later formed on surface 11 of the substrate, and the remainder formed a thick, uniform coating at the back ends of the holes for interconnections. This result was achieved in spite of the fact that evaporation of the solvents produced an approximate 75 percent reduction in the volume of the paste material.

The baking can be repeated with the printed side positioned up in order to vaporize any solvent which might have condensed on the printed side during the first bake. Such a second bake will probably not be needed in most applications.

For the particular paste utilized in this example, it is recommended that baking be performed at maximum temperatures in the range 80–180 degrees C. for a time of 5 min-2 hrs. For thick film pastes, in general, baking within the range of 80–220 degrees C. for 5 min.–2 hrs. would appear desirable.

The remaining paste material, which consisted essentially of copper, glass frit and the ethyl cellulose binder, was then sintered in order to establish the desired conductivity. There is a further volume decrease of the material during sintering as a result of the pyrolysis of the binder. It was found, however, that the geometry of the paste obtained after baking could best be preserved by first firing in an oxidizing atmosphere to convert the copper to copper oxide. The shrinkage in volume which occurs during such firing is much more uniform than could be obtained by firing in a neutral or reducing atmosphere.

Thus, the paste was first fired in air at a temperature of approximately 970 degrees C. for 10 minutes. A useful firing range for this paste appears to be 700–1100 degrees C. for 1 min.–1 hr. The paste was then fired at approximately 900 degrees C. for 10 minutes in a reducng atmosphere to convert the copper oxide to copper and establish the desired conductivity. In this particular example, the atmosphere was 90% $N_2$ + 10% $H_2$ but any reducing atmosphere appears suitable. A useful firing range for this paste appears to be 250–1000 degrees C. for 1 min.–1 hr. Firing ranges for other pastes will be dependent on their constituents and can be easily determined by those skilled in the art.

The sheet resistance obtained as a result of these firing steps was approximately 0.005 ohms per square per mil thick. In general, a sheet resistance for the conductors of less than 0.02 is desirable.

In succeeding steps, the complete circuit was formed on surface 11 of the substrate. In this example, a thin film circuit was formed by standard techniques. For purposes of illustration, a portion of the circuit is shown in FIG. 3. The thin film conductors, 17, were evaporated layers of titanium-palladium-gold, with additional electroplated gold and the resistors, 18, were evaporated tantalum nitride. It should be appreciated that the circuit includes many more thin film elements and also includes integrated circuit chips bonded to the substrate to form a hybrid circuit. A thick film or combination thick and thin film circuit may also be formed by standard techniques. In the fabrication of such thick film circuits, the paste described herein can form conductors on both sides of the substrate, or a different paste material may be employed on one side in combination with the present invention. For example, formation of the circuit with a fritless copper paste and ruthenium-based resistor materials is compatible with the present invention (see, U.S. patent application of J. F. Brown, Ser. No. 848,509, filed Nov. 4, 1977).

Various additional modifications will become apparent to those skilled in the art. All such variations which basically rely on the teachings through which the invention has advanced the art are properly considered within the spirit and scope of the invention.

We claim:

1. A method of fabricating bi-level circuits including metallizing holes (14 and 15) through an insulating substrate (10) comprising the steps of: depositing a thick film paste (13) onto one major surface (12) of said substrate and filling said holes, said paste including a material selected from the group consisting of a metal and metal oxide, and an organic vehicle comprising a binder and at least one solvent; heating the resulting structure to evaporate the solvent; and firing the remaining paste material to establish a desired conductivity CHARACTERIZED IN THAT the structure is heated with the deposited surface down to create a solvent concentration gradient in the paste filling the holes during heating so that the bulk of the paste accumulates in the holes near the surface (11) opposite the deposited surface to form contact pads (16) at the opposite surface and the remaining paste coats the walls of the holes near the deposited surface.

2. The method according to claim 1 wherein the firing is done first in an oxidizing atmosphere and then in a reducing atmosphere.

3. The method according to claim 1 wherein the binder comprises ethyl cellulose.

4. The method according to claim 3 wherein the organic vehicle further comprises butyl carbitol acetate and alpha terpineol as solvents.

5. The method according to claim 1 wherein the metal is selected from the group consisting of copper, silver, palladium, nickel, gold and alloys thereof.

6. The method according to claim 1 wherein the metal is copper.

7. The method according to claim 1 wherein heating is done at a maximum temperature of 80–220 degrees C. for 5 min.–2 hrs.

8. The method according to claim 2 wherein firing is done at a temperature of 700–1100 degrees C. for 1 min.–1 hr. in an oxidizing atmosphere and 250–1000 degrees C. for 1 min.–1 hr. in a reducing atmosphere.

9. The method according to claim 1 wherein the holes have a diameter in the range 3–50 mils and thicknesses in the range of 10–75 mils.

10. The method according to claim 1 wherein the solids content of the paste is within the range of approximately 40–90 percent by weight.

11. The method according to claim 1 wherein, during heating, the deposited surface is placed at a small distance from a horizontal support member (25) in order to control evaporation of the solvents at said surface and establish the solvent concentration gradient.

12. The method according to claim 1 wherein the paste further comprises a glass frit.

13. A method of fabricating bi-level circuits including metallizing holes (14 and 15) through an insulating substrate comprising the steps of: screen printing a thick film paste (13) onto one major surface (12) of said substrate and filling said holes, said paste including copper, glass frit, and an organic vehicle comprising a binder of ethyl cellulose and at least one solvent; heating the resulting structure to evaporate the solvent; and firing the remaining paste material to establish a desired conductivity;

CHARACTERIZED IN THAT the structure is heated with the deposited surface down to create a solvent concentration gradient in the paste filling the holes during heating so that the bulk of the paste in the holes accumulates near the surface (11) opposite the printed surface to form contact pads (16) at the opposite surface and the remaining paste coats the walls of the holes near the printed surface, and firing is done first in an oxidizing atmosphere and then in a reducing atmosphere.

14. A method of fabricating bi-level circuits including metallizing holes (14 and 15) formed through an insulating substrate (10) with diameters in the range 3–50 mils and thicknesses in the range 10–75 mils, comprising the steps of:

screen printing a thick film paste (13) onto one major surface (12) of said substrate and filling said holes, said paste comprising copper, glass frit, and an organic vehicle comprising a binder of ethyl cellulose and solvents of butyl carbitol acetate and alpha terpineol; heating the resulting structure to evaporate the solvents, and firing the remaining paste material to establish a desired conductivity;

CHARACTERIZED IN THAT the molecular weight of the ethyl cellulose is less than or equal to 40,000, the glass frit does not contain lead and the copper and glass frit comprise approximately 40–90 percent by weight of the paste; the structure is heated at a maximum temperature in the range 80–180 degrees C. for 5 min.–2 hrs. with the printed surface down and placed approximately 20–120 mils from a setter plate (25) to control evaporation of the solvents at said surface thereby establishing a solvent concentration gradient in the paste filling the holes during heating so that the bulk of the paste in the holes accumulates near the surface (11) opposite the printed surface to form contact pads (16) at the opposite surface and the remaining paste coats the walls of the holes near the printed surface; the heating can be repeated with the printed surface up to remove any solvent which might have condensed during the first heating; and the paste is first fired at a temperature within the range 700–1100 degrees C. for 1 min.–1 hr. in an oxidizing atmosphere and then at a temperature within the range 250–1000 degrees C. for 1 min.–1 hr. in a reducing atmosphere.

* * * * *